United States Patent
Thompson et al.

(10) Patent No.: US 9,910,093 B2
(45) Date of Patent: Mar. 6, 2018

(54) GENERATOR NEUTRAL GROUND MONITORING DEVICE UTILIZING DIRECT CURRENT COMPONENT MEASUREMENT AND ANALYSIS

(71) Applicant: Siemens Energy, Inc., Orlando, FL (US)

(72) Inventors: Edward David Thompson, Casselberry, FL (US); James F. Lau, Orlando, FL (US)

(73) Assignee: SIEMENS ENERGY, INC., Orlando, FL (US)

( * ) Notice: Subject to any disclaimer, the term of this patent is extended or adjusted under 35 U.S.C. 154(b) by 408 days.

(21) Appl. No.: 14/644,257

(22) Filed: Mar. 11, 2015

(65) Prior Publication Data
US 2016/0266206 A1  Sep. 15, 2016

(51) Int. Cl.
*G01R 31/34* (2006.01)
(52) U.S. Cl.
CPC .................. *G01R 31/343* (2013.01)
(58) Field of Classification Search
CPC ....... H02K 11/20–11/27; G01R 31/025; G01R 31/34; G01R 31/343
See application file for complete search history.

(56) References Cited

U.S. PATENT DOCUMENTS

| 4,156,846 | A | * | 5/1979 | Harrold | G01R 31/025 324/102 |
| 5,521,482 | A | * | 5/1996 | Lang | G01R 31/343 318/800 |
| 6,421,618 | B1 | | 7/2002 | Kliman et al. | |
| 6,460,013 | B1 | * | 10/2002 | Nippes | G01R 31/343 702/183 |
| 6,909,989 | B2 | * | 6/2005 | Thompson | G05B 5/01 324/765.01 |
| 7,253,634 | B1 | | 8/2007 | Kasztenny et al. | |
| 7,719,285 | B2 | * | 5/2010 | Johansson | H02H 3/17 318/434 |
| 2010/0010684 | A1 | * | 1/2010 | Lorenz | H02H 7/06 700/293 |

(Continued)

OTHER PUBLICATIONS

PCT International Search Report and Written Opinion dated May 25, 2016 corresponding to PCT Application No. PCT/US2016/017990 filed Feb. 16, 2016 (14 pages).

*Primary Examiner* — Eric Ward

(57) ABSTRACT

A device and method for detecting and analyzing faults in a generator stator are disclosed. The device and method include measuring a direct current component of a neutral ground current in a generator stator grounding conductor, analyzing the direct current flow and comparing it with other ground fault indicators, and providing diagnosis and recommended actions based on the analysis. The direct current flow is measured by a sensitive direct current sensor that may also measure AC components via oscillations in the current measurement, such as a Hall Effect sensor, placed on the generator stator grounding conductor. The analysis of the direct current signal includes consideration of the generator operating conditions and environmental conditions, and also includes comparison to historical data representing both normal and abnormal operation of the generator. Alarms and advisories are provided when generator faults are detected or predicted.

18 Claims, 2 Drawing Sheets

(56) References Cited

U.S. PATENT DOCUMENTS

2012/0086458 A1    4/2012   Wei et al.
2013/0285671 A1   10/2013   Hoffman et al.
2014/0107955 A1    4/2014   Thompson et al.

\* cited by examiner

GENERATOR NEUTRAL GROUND MONITORING DEVICE UTILIZING DIRECT CURRENT COMPONENT MEASUREMENT AND ANALYSIS

BACKGROUND OF THE INVENTION

Field of the Invention

This invention relates generally to identifying ground faults in a stator winding of an electrical generator and, more particularly, to a device and method for detecting and analyzing neutral ground faults which includes measuring a direct current component of a neutral ground current in a generator stator grounding conductor, analyzing the direct current flow and comparing it with other ground fault indicators, and providing diagnosis and recommended actions based on the analysis.

Description of the Related Art

Electrical power generators convert mechanical power into one or more electrical currents, one from each series of coils, or winding. It is beneficial to protect electrical power generators against external faults and internal faults. Generators can be protected against external faults by several circuit breakers that isolate the faults that could occur in the power plant network (e.g., transformers, buses, lines . . . ). At the same time, electrical power generators can also be protected against faults that could occur inside the machine itself.

Many electrical power generators in power plants are of a three-phase design that utilizes a "Y" winding configuration. In this type of design, all three phases of the stator are connected at one end, typically by a large bus bar, which corresponds to the center of the "Y". Usually, this bus bar is also grounded. In most instances the grounding point that is selected is the power plant's earth ground and the bus bar is connected to the ground through a transformer that is commonly referred to as a neutral grounding transformer.

In an ideal operation, the current flow to ground would hypothetically be nearly zero. A very small current will flow to ground through the generator side of the neutral grounding transformer, largely due to capacitance of the complete generator, and all components tied to it electrically. When a fault to ground occurs in any of these electrically connected components, the current will rise. The transformer is typically designed to limit ground fault current to 20 Amperes to minimize consequential damage from the ground fault.

For example, a ground fault in a generator stator winding is one of the most frequent types of internal electrical generator fault. A ground fault can be caused by, for example, physical damage to the stator winding or aging of the insulation of the stator and can cause additional damage to the stator and cause the electrical power generator to fail.

In the past, analysis of the current passing through a neutral grounding circuit (e.g., that includes a neutral grounding transformer and an impedance) has focused on the alternating current component which is naturally present and dominant. However, a direct current component may also be present in a generator grounding circuit, and this direct current component cannot be detected in the output of the neutral grounding transformer. It would be desirable to detect the direct current component in the grounding circuit, as the direct current component may be useful in diagnosing fault conditions in the generator.

SUMMARY OF THE INVENTION

In accordance with the teachings of the present invention, a device and method for detecting and analyzing neutral ground faults in a generator stator are disclosed. The device and method include measuring a direct current component of a neutral ground current in a generator stator grounding conductor, analyzing the direct current flow and comparing it with other ground fault indicators, and providing diagnosis and recommended actions based on the analysis. The direct current flow is measured by a sensitive direct current sensor that may also measure AC components via oscillations in the current measurement, such as a Hall Effect sensor, placed on the generator stator grounding conductor. The analysis of the direct current signal includes consideration of the generator operating conditions and environmental conditions, and also includes comparison to historical data representing both normal and abnormal operation of the generator. Alarms and advisories are provided when generator faults are detected or predicted.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a generator neutral ground monitoring device utilizing direct current component measurement and analysis is merely exemplary in nature, and is in no way intended to limit the invention or its applications or uses.

Electrical generators of the type used to generate electricity for utilities are large, complex machines. In order to minimize downtime and expensive repairs, it is important to monitor the generators for early indications of any problems which might occur. Neutral ground faults from the generator stator or partial discharge are specific examples of problems which can occur in generators, due in part to the vibrations associated with the generator's operation. Left uncorrected, these problems can cause costly damage to the generator. Techniques, systems and methods involving improved monitoring of a generator neutral ground current flow are described herein.

Existing generator neutral ground monitoring devices (protection relays) are typically located on the secondary side of a neutral grounding transformer (NGT). The transformer will not pass the direct current (DC) component or very low frequency components of the current/voltage waveform and therefore no analysis of DC components of the generator neutral ground current flow is possible. All evaluations and generator monitoring are focused on the alternating current that is produced in the generator windings and ground connection. Since evaluations of generator data after failures are done using existing data, the DC and very low frequency components, which may be evident as slow and potentially irregular oscillations of the DC component—which have traditionally not been measured—are not evaluated and cannot be correlated to any specific problem or to verify a theory about what is expected.

Because the DC portion of the generator neutral ground current/voltage has been completely ignored, other monitoring devices have been designed to determine if certain conditions exist without the benefit of knowing the DC ground current or voltage. This has resulted in additional monitoring systems installed on the generator at additional cost, with the monitoring systems often only monitoring for one specific condition.

Figure 1:
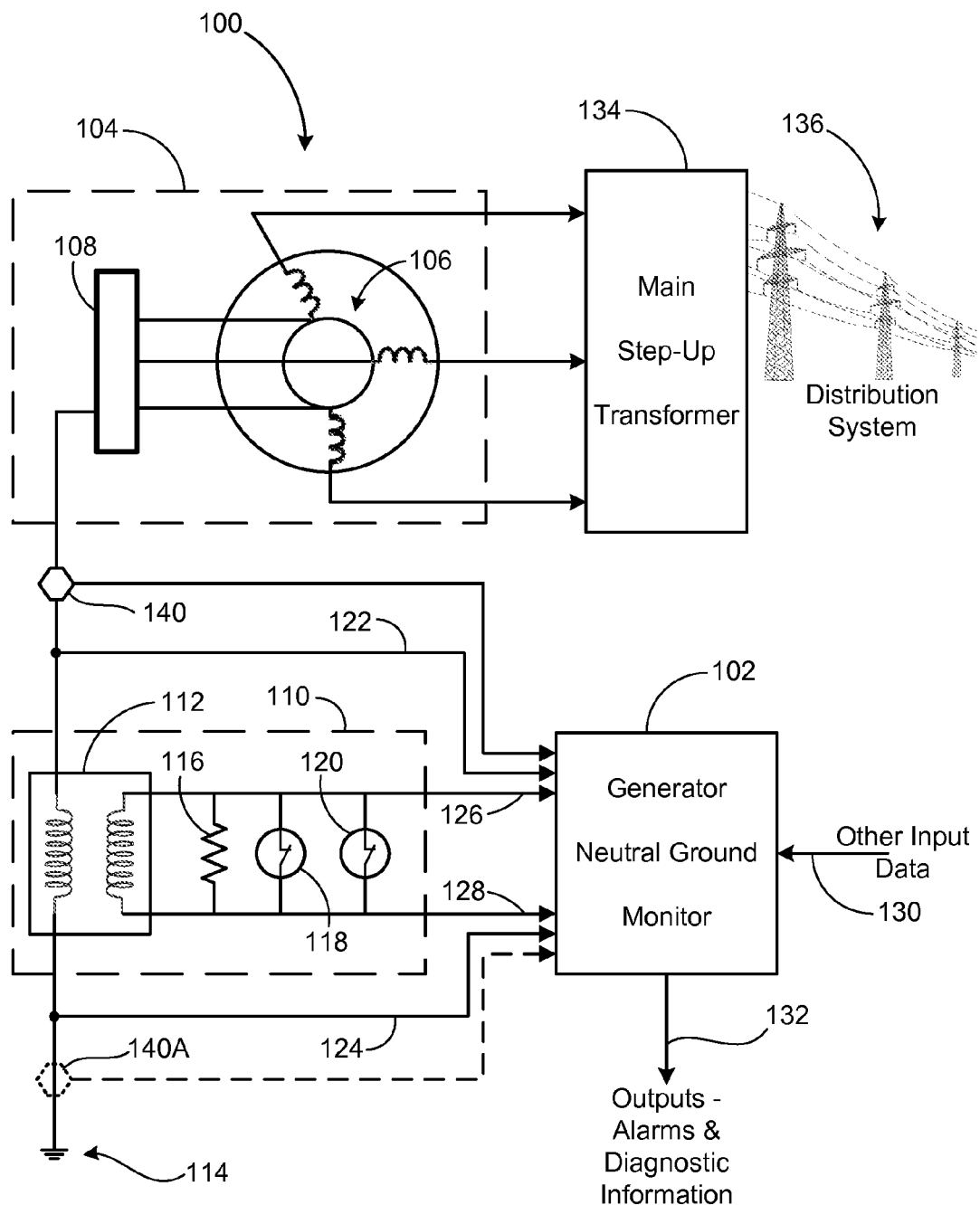
FIG. 1 is a schematic diagram of an electrical power generator system with a direct current neutral ground monitoring device in accordance with the present invention.

FIG. 1 is a schematic diagram of an electrical power generator system 100 with a direct current neutral ground monitoring device in accordance with the principles of the present invention. With respect to FIG. 1, a generator neutral ground monitor 102 is depicted within the context of the more general environment of the electrical power generator system 100. While an electrical generator 104 can be assembled with a variety of different winding configurations, many generators in power plants are of a three phase design that utilizes a Y winding configuration 106, as shown in FIG. 1. The principles and techniques described herein do not require a Y winding configuration but may be applicable to other winding configurations as well (e.g., a delta configuration).

A stator ground fault is one of the most common types of faults to which generators are subjected. Stator ground faults can, for example, be caused by insulation degradation in the windings 106 of the generator 104 as a result of vibration and aging effects, as well as environmental influences such as moisture or oil in combination with dirt which settles on the coil surfaces outside the stator slots. This often leads to electrical discharges in the windings 106 which damage the winding insulation and cause a winding short to ground. In general, a stator ground fault is a single-phase to ground fault; or, in other words, it involves one of the three windings 106 of the generator 104.

There are at least two reasons to predict and prevent generators from experiencing stator ground faults. Firstly, they are faults and that means they are irregular situations in the operation of the generator 104 causing non-desirable voltages, currents, oscillations or damage. Secondly, an undetected and non-cleared ground fault, potentially undetected because it is on a neutral coil in the winding, could develop into a phase-to-phase fault or into an inter-winding fault if another single-phase to ground fault occurs. Because phase-to-phase faults and inter-winding faults are short-circuits, they may cause immediate damage to the generator 104 resulting from the high short-circuit current.

In the winding configuration of FIG. 1, all three phases are connected at the neutral end to a bus bar 108 that corresponds to the center of the Y. The bus bar 108 is grounded through a high-impedance circuit, such as a neutral grounding transformer 112, to the power plant's earth ground 114. During normal operation of the generator 104, the current flow from the neutral bus bar 108 to the ground 114 should be minimal, although inherent capacitance between the windings 112 and the ground 114 will result in at least some current flow.

The neutral grounding transformer and standard protection system 110 can include a number of other devices in addition to the transformer 112. For example, a resistor 116 can be placed in parallel to the transformer 112 so that current flowing through the resistor 116 will produce a voltage potential across the terminals of the resistor 116. An over-voltage protection relay 118 can be included such that if the voltage across the resistor 116 exceeds a predetermined value for more than a predetermined time period, the relay can trip and stop operation of the generator 104. Typically, the over-voltage trip relay is tuned for the primary operating frequency (e.g., 60 Hz) of one of the windings of the generator 104. Also, an under-voltage trip relay 120 can be included that detects voltage conditions relating to one or more harmonic frequencies (e.g., third harmonic) of the primary operating frequency of the generator 104.

In either case, the over-voltage relay 118 or the under-voltage relay 120 detects a near-instantaneous voltage level value across the resistor 116 that is indicative of the current flowing through the transformer 112 to the ground 114.

In addition to protection provided by the over-voltage relay 118 and the under-voltage relay 120, the generator neutral ground monitor 102 uses the neutral ground voltage waveform, historical data, operating conditions, and other information to detect, predict and prevent faults rather than simply stopping operation of the generator 104. Embodiments describing some of the functionality of the generator neutral ground monitor 102 were disclosed in U.S. patent application Ser. No. 13/651,646 (hereinafter "the '646 application"), filed Oct. 15, 2012, assigned to the assignee of the present invention, and herein incorporated by reference. Thus, the monitor 102 can provide supplemental protection to, or even eliminate the need for, the over-voltage relay 118 and the under-voltage relay 120, by monitoring the neutral ground voltage waveform for over- and under-voltage conditions in order to provide equivalent control signals to stop operation of the generator 104.

The monitor 102 is a computing device including at least a microprocessor and a memory module, of any type commonly used in operational control systems. The monitor 102 may be a general purpose device which also performs other computing functions, or the monitor 102 may be a custom design which is configured specifically for identifying neutral ground faults in generators. In any case, the monitor 102 is configured to perform the steps of the methods discussed herein. That is, the methods for neutral ground fault identification are intended to be carried out on a computing device such as the monitor 102, not in a person's head or using paper and pencil.

In order to provide the monitoring functions described above, the monitor 102 receives input signals from the primary side of the transformer 112 on line 122 (before the windings of the transformer 112) and on line 124 (after the windings of the transformer 112). The monitor 102 also receives input signals from the secondary side of the transformer 112 (across the resistor 116) on line 126 and on line 128. As described in the '646 application, the monitor 102 analyzes the waveforms on the lines 122-128 to determine whether or not the voltage waveform is indicative of an operating fault of the generator 104 or is indicative of conditions that have preceded operating faults in the past.

The monitor 102 also receives other input data on line 130, including the current generator load, and other operating condition data, from the various components of the electrical generator system's environment, as well as historical data. Using the inputs on the line 130 and the other inputs described above, the monitor 102 is able to detect generator faults much earlier than previous devices, and potentially identify the nature of the fault, as well as estimating a time to failure. In this way, repairs can be planned in advance instead of the "forced outage" situation caused by a voltage protection trip relay (e.g., 118, 120). One benefit of preventing forced outages is that such occurrences are costly to electrical generating utilities since the absence of planning results in longer equipment outage time, and the extra outage time reduces the opportunity to produce electricity. The earlier a problem is detected, the earlier repairs can be performed. Early repairs minimize the potential damage caused by any winding problem and reduce repair costs as well.

Outputs from the monitor 102 are provided on line 132. Outputs can include alarms, diagnostic information and generator shut-down signals, among other things. For completeness, FIG. 1 also includes a main step-up transformer 134 that prepares the electricity generated from the generator 104 for a power distribution system 136. In situations requiring immediate shut-down, the relays 118 and 120, and the monitor 102, can stop operation of the generator 104 by any suitable means, including breaking a connection of the rotor field excitation system, disconnecting the generator 104 from the distribution system 136, etc.

With all of the above as background, the present invention proposes further enhancement of generator neutral ground monitoring by detecting and analyzing a direct current component of a neutral ground current waveform, including impulse behavior if present. The system 100 of FIG. 1 includes a direct current (DC) sensor 140, positioned between the generator 104 and the primary side of the transformer 112, for measuring the direct current component and low frequency AC components of a generator neutral ground fault. FIG. 1 also shows a direct current sensor 140A positioned between the primary side of the transformer 112 and the ground 114, where the DC sensor 140A is an alternate location for the DC sensor 140. Although both the DC sensors 140 and 140A could be used in the system 100, only one direct current sensor is needed (hereinafter referred to as sensor 140) for the disclosed methods.

As discussed above in detail, previous neutral ground monitoring techniques involved analyzing waveforms from the neutral grounding transformer 112 and the standard protection system 110. However, transformer secondary winding connections do not transmit any direct current component of an electrical signal passing through the primary transformer winding. Furthermore, any direct current component of a neutral ground fault will typically be small and may be short in duration, and may not be detectable by sensors in the monitor 102. As a result, generator neutral ground fault detection and analysis has concentrated on alternating current signals, and direct current ground fault analysis has not been undertaken in the past.

The present invention improves on past neutral ground fault detection by placing a sensitive direct current sensor (the DC sensor 140) in the generator neutral grounding line from the bus bar 108 to the ground 114. In one embodiment, the DC sensor 140 is a Hall Effect sensor, which can detect a direct current component of a ground fault even if the direct current component is very small and/or very brief in duration. Note that such a sensor will record the changing waveform to some degree and thus also include AC components of the waveform. Derivation of the DC component as read by the DC sensor may occur via a natural averaging property of the sensor itself, analog or digital averaging of the resulting signal, or via numerical evaluation of the signal as a whole, such as determining the zero Hz. component of the signal after conversion to the frequency spectrum. It is not important how the DC portion of the signal is extracted, as long as the sensor is capable of measuring a DC signal. The DC sensor 140 (or, in the alternate location, the DC sensor 140A), provides its output signal to the monitor 102 for analysis.

As mentioned above, direct current neutral ground monitoring has not traditionally been done, because any ground fault current from the neutral bus bar 108 will naturally be predominantly alternating current, like the voltage field on the generator stator itself. However, it has been determined that some types of stator faults result in a direct current ground fault component. It has further been determined that detection and analysis of this direct current ground fault component can be instructive as to the nature of the fault.

The analysis of the neutral ground direct current component can be useful both in proactive problem diagnosis and in after-the-fact failure evaluation. In proactive problem diagnosis, the direct current component analysis can be used to detect and diagnose problems which may be developing in the generator 104, but which have not yet reached a critical level. For example, partial discharge (PD) is a phenomenon where electrons from the high voltage copper windings 106 jump across small voids or damaged areas in the insulation toward the low voltage components exterior to the coil due to deterioration of the winding insulation. Partial discharge events are typically brief and intermittent, being dependent upon the voltage potential between the winding and the core, which is cyclic, and upon vibration and other mechanical factors. In a typical partial discharge event, more charge passes in one direction than the other, which produces a small direct current component. High-resolution measurement and analysis of the direct current component may lead to better detection and diagnosis of partial discharge events, and the ability to correct the underlying insulation problem before serious damage occurs or an unplanned generator shutdown is required.

Other direct current sources may be present which the DC sensor 140 could also detect, and some of these sources may not be evident from present generator theory. Occasionally a slight direct current bias has been observed on armature bars that are built with semi-conducting surface treatments. Also, direct current bias is induced during some fault conditions on specific phases. This could couple to the neutral in a measurable fashion if a phase is grounded elsewhere in the circuit.

As experience is gained with neutral ground direct current measurement and analysis, different direct current component signatures can be correlated with specific faults and failure modes, along with their severities and potentially even locations. A machine learning algorithm can be employed to correlate ground fault direct current signals with respect to generator operating conditions and fault conditions, as discussed below.

The ground fault direct current measurement and analysis techniques disclosed herein will not only provide diagnostic capability for these generator malfunctions by itself, but will also serve to provide collaborating evidence for other monitoring capabilities of the monitor 102. Time is often lost after a monitoring device provides a warning of a problem, as plant operators take time to verify the monitoring equipment is functioning properly and the alarm is valid. If there is another, independent source of monitor data providing collaborating evidence, plant operators can take immediate action and potentially avoid costly additional equipment damage as the problem worsens during the investigation. That is, if a significant direct current component is measured by the DC sensor 140, in conjunction with an abnormal voltage from the neutral ground transformer 112 across the resistor 116, then there can be a very high degree of certainty that a real fault has occurred. With such fault detection certainty, plant operators can also begin outage planning sooner, which can minimize further generator damage and realize cost savings due to the additional opportunities that may exist with earlier scheduling of the generator shutdown and repairs.

Ground fault direct current measurement data from the DC sensor 140 can also be stored and saved for a period of time in the monitor 102. The stored data can then be used in analysis of faults and failures observed when the generator 104 has been shut down, inspected and repaired. In after-the-fact failure evaluation, the neutral ground direct current component can be analyzed in light of a known fault that occurred in the generator 104. For example, if the generator 104 is shut down, for routine maintenance or otherwise, and evidence of electrical arcing is found in areas where winding insulation has deteriorated, the direct current measurement data can be reviewed for the time period leading up to the shutdown, to see if a neutral ground direct current component signature can be correlated to the known generator fault.

As described previously, the signal from the DC sensor 140 can be provided to the monitor 102, where a processor can be configured to analyze the DC signal. The DC signal analysis, discussed below, can be performed in conjunction with the other neutral ground monitoring functions—such as monitoring output of the neutral grounding transformer 112 on the lines 126 and 128.

Figure 2:
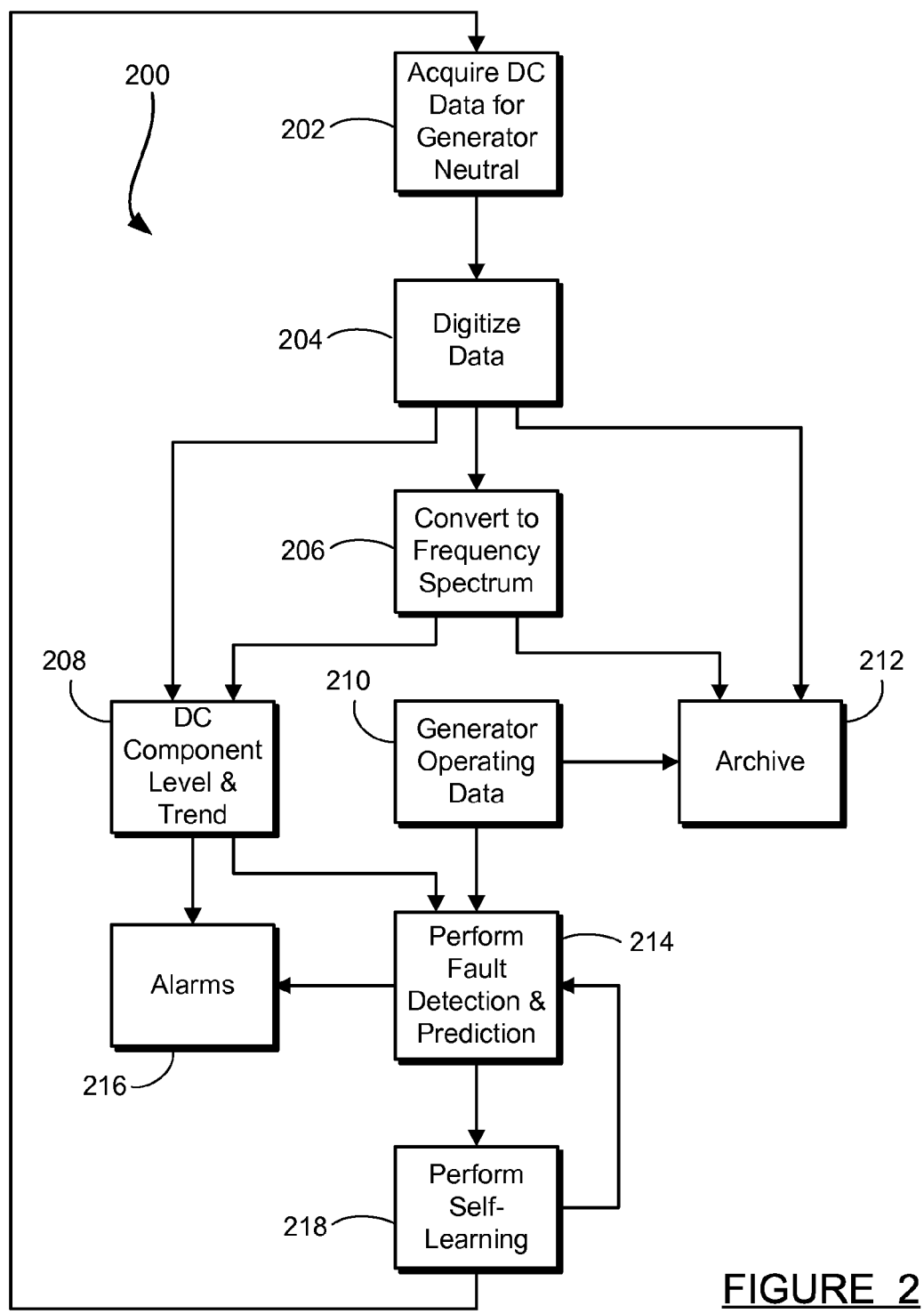
FIG. 2 is a flowchart diagram of a method for generator neutral ground monitoring including direct current component measurement and analysis.

FIG. 2 is a flowchart diagram 200 of a method for generator neutral ground monitoring including direct current component measurement and analysis. At box 202, current flow through the generator neutral ground line is measured, including a DC signal from the DC sensor 140. The current data acquired at the box 202 can also include AC data, from both the primary side and the secondary side of the NGT 112, as is typically used in generator neutral ground monitoring. At box 204, the current data from the box 202—which is typically analog data as provided by the sensor 140—is converted to a digital format suitable for digital signal processing.

At box 206, the waveform from the DC sensor 140 that may also contain AC current components is converted to the frequency spectrum by performing a Fourier Transform (FT). Other similar algorithms such as a Fast Fourier Transform (FFT) or other mathematical technique for deriving frequency components such as digital filtering may be used. Analog equivalents to the input signal may also be used, and any expert in the state of the art would be able to substitute such analysis techniques for a FT analysis. The FT operation at the box 206 may reveal a zero Hz (DC) component, which can be used for correlation with the DC signal from the DC sensor 140.

At box 208, the DC signal data is evaluated to see if the magnitude is large enough to trigger an immediate alarm at box 216. The evaluation at the box 208 is a simple comparison of the direct current flow to a threshold value. The trend (rate of change) of the direct current flow and the shape of its historical trend may also be evaluated at the box 208, and may also trigger an alarm if the trend exceeds a predetermined threshold. The DC signal evaluation at the box 208 can be performed on the digitized data from the DC sensor 140 (from the box 204), and also on the zero Hz component of the FFT output from the box 206.

At box 210, generator operating data is provided, as shown on the line 130 of FIG. 1. As discussed previously, the operating data provided at the box 210 may include the load currently being applied to the generator 104, and other operating condition data, from the various components of the electrical generator system 100. The operating data at the box 210 will also include environmental data, such as temperature and humidity. The operating data will be described further below, in a discussion of the fault detection algorithms.

At box 212, the digitized current data, the frequency spectrum data and the operating data are archived. Archived data may be used for after-the-fact correlations between generator faults, determined through shutdown and inspection, and the data during generator operation leading up to the shutdown. The archived data may be used for any other purpose as typical of archived data.

At box 214, fault detection and prediction is performed, using the DC neutral ground signal from the box 208 and the generator operating data from the box 210. Details of this fault detection and prediction are discussed below. At the box 216, alarms may again be triggered, this time as a result of the fault detection and prediction at the box 214. In addition to alarms, less urgent messages such as alerts and advisories can be provided at the box 216. Alerts and advisories may indicate that certain parameters should be monitored closely, that one or more diagnostic tests should be performed in the near future, or that various tests and/or inspections should be performed at the next generator shutdown.

At box 218, self-learning is performed as follow-up to the fault detection and prediction which was performed at the box 214. The self-learning function at the box 218 identifies relationships between DC neutral ground data and operating condition data which, over time, can be correlated to normal system performance or, conversely, indicative of a developing problem. The self-learning function will also be discussed further below. Output from the self-learning analysis at the box 218 is provided back to the box 214 for subsequent fault detection and prediction analysis. From the box 218, the process loops back to again acquire generator neutral ground current data at the box 202.

The fault detection and fault prediction performed at the box 214 may include several different analysis methods. While the DC signal level and trend evaluation at the box 208 is designed to identify an abnormally high DC neutral ground signal, the fault detection and fault prediction performed at the box 214 is designed to identify more subtle characteristics of the DC neutral ground signal.

The measured DC component in the generator neutral ground can be evaluated in consideration of other parameters to determine if malfunctions are occurring or progressing in the generator 104. The normal DC component of current will be a function of many measurable parameters, including but not necessarily limited to; Generator Load, Dew Point, Terminal Voltage, Liquid Detector alarm Frequency, Ambient Temperature, Generator Temperatures, Barometric Pressure and Ozone Level. Therefore:

$$I_{DC}=f(GL,DP,TV,LDF,AT,GT,BP,OL, \ldots) \tag{1}$$

Where $I_{DC}$ is the DC component of generator neutral current, and the other variables in the function are recited above.

The function represented by Equation (1) is a complex relationship, and it is not feasible to attempt to use physical laws to derive the function. Instead, measured data can be used to build an understanding, over time, of normal vs. abnormal behavior. In one embodiment, two levels of algorithms can be used to analyze $I_{DC}$.

First, the expected value of $I_{DC}$ is determined by mathematical modelling of the measured current vs. the other measured parameters. This is the first part of the fault detection and prediction which is performed at the box 214 of FIG. 2. Various methods can be used for this modelling, including non-parametric regression analysis, neural nets, or other techniques where computer models empirically determine the relationship based on historical and ongoing data. This process is often referred to as "machine learning".

An example is provided here to illustrate how the relationships between generator operating data and environmental data can be correlated to the measured value of $I_{DC}$. In the case of partial discharge (PD), very high or very low values of the dew point temperature (DP) have been observed to cause a decrease in PD and therefore a decrease in the value of $I_{DC}$. Therefore, if the dew point should increase from a very low level to a medium level, the resulting increase in $I_{DC}$ may be normal and not evidence of increasing PD distress. The model will assess if the increase is outside expected boundaries. PD is also linked to ozone level and terminal voltage. A combination of changes can be processed by the model algorithm to yield an expected value of $I_{DC}$ based on all of the measured parameters. The sign of $I_{DC}$ is also indicative of the location of the partial discharge. $I_{DC}$ will flow in one direction if the PD is in the coil insulation, or in the opposite direction if the PD is in the stator core insulation.

Second, the measured value of $I_{DC}$ can then be compared to the historical results of the model to determine if the $I_{DC}$ level is abnormal. The historical results for this second part of the analysis come from the self-learning which is performed at the box 218 of FIG. 2. If the level is abnormal, the deviation combined with the other measured parameters can yield a diagnosis of the cause of the deviation. This diagnosis is also accomplished by computer analysis including, but not limited to; machine learning, expert systems (rule based analysis), case based reasoning, first principle evaluation, or various fuzzy logic methodologies.

A database of the operating data for each generator must be maintained so the mathematical model can be trained and updated. As discussed above, the data archiving at the box 212 serves this function. The model can also benefit from the operating data from other generator installations, since a shift in one of the measured parameters may result in a similar shift in $I_{DC}$ for generators of a similar frame size. A non-characteristic shift in $I_{DC}$ could be evidence of a malfunction.

The historical analysis will link the deviation between the model and the measured $I_{DC}$ to a diagnosis, such as PD, with additional details such as the likely location of the PD. Other diagnostic results will be driven by different combinations of the measured parameters. As these malfunctions are observed and documented in the field, the self-learning algorithm will be modified to include the additional results. In this way the generator neutral ground monitor 102 can benefit from the analysis results from other generators that have had a malfunction.

As discussed previously, the generator neutral DC signal analysis described above can be performed in the generator neutral ground monitor 102 of FIG. 1, and combined with other generator neutral ground signal analyses—such as monitoring of the output signal from the secondary of the neutral ground transformer 112. The combination of DC signal analysis with other generator neutral ground monitoring provides a level of fault detection and prediction not previously available.

Using the techniques described above, generator stator neutral ground faults can be detected and diagnosed more effectively than previously possible, by analyzing a DC component of the neutral ground signal. The more efficient discovery, diagnosis and repair of stator ground faults—made possible by neutral ground DC component measurement and analysis—can reduce generator downtime and maintenance costs, and prolong the productive life of the generators.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A generator neutral ground monitoring device, said device comprising:
   a direct current (DC) sensor placed on a stator neutral ground lead of a generator, said DC sensor measuring a direct current component of a generator neutral ground current and providing a DC neutral ground signal;
   an operating environment data module which provides generator operating environment data, where the operating environment data includes generator operating condition data and ambient condition data; and
   a monitor module including a processor and a memory, said monitor module being configured to receive the DC neutral ground signal and the operating environment data, analyze the DC neutral ground signal in consideration of the operating environment data to detect and predict faults in the generator, and issue an alarm or a diagnostic message if a fault is detected,
   wherein the monitor module also receives an AC neutral ground signal that includes a DC component, either from the DC sensor or from another sensor capable of reading the DC component, converts the AC neutral ground signal to a frequency spectrum via a Fourier Transform (FT), and uses a zero hertz component of output from the FT as a supplemental indicator of generator neutral ground direct current flow to compare to the DC neutral ground signal.

2. The device of claim 1 wherein the monitor module includes an archive function for storing the DC neutral ground signal data and the operating environment data for later evaluation when a fault is identified in the generator.

3. The device of claim 1 wherein the monitor module evaluates a magnitude and a rate of change of the DC neutral ground signal, and issues an alarm if the magnitude or the rate of change exceeds a predetermined threshold.

4. The device of claim 1 wherein the monitor module performs fault detection and prediction using a two-part analysis, where a first part includes analyzing the DC neutral ground signal in consideration of the operating environment data for a current condition, and a second part includes analyzing the DC neutral ground signal in consideration of the operating environment data for historical conditions which represent both normal and abnormal generator operation.

5. The device of claim 4 wherein the operating environment data includes generator load, dew point, terminal voltage, liquid detector alarm frequency, ambient temperature, generator temperatures, barometric pressure and ozone level.

6. The device of claim 4 wherein the monitor module includes a learning feature, where the learning feature includes self-learning by identifying correlations between the DC neutral ground signal and the operating environment data for both normal and abnormal generator operation, and the learning feature also includes manually-programmed learning where inspection-confirmed faults in the generator or another generator of the same type are manually correlated to the DC neutral ground signal and the operating environment data during a time preceding the inspection-confirmed faults, and where output of the learning feature is used in the second part of the fault detection and prediction analysis.

7. The device of claim 1 wherein the monitor module analyzes the AC neutral ground signal to detect and predict faults in the generator, and correlates faults detected and predicted through analysis of the AC neutral ground signal with faults detected and predicted through analysis of the DC neutral ground signal.

8. A system for monitoring a generator neutral ground signal, said system comprising:
   a Hall Effect direct current (DC) sensor placed on a stator neutral ground lead of a generator, said sensor measuring a direct current component of a generator neutral ground current and providing a DC neutral ground signal;
   a neutral grounding transformer (NGT), said transformer having a primary side coupled to the stator neutral ground lead and a secondary side which provides an NGT signal, where the NGT signal corresponds to an amount of alternating current (AC) on the stator neutral ground lead;
   an operating environment data module which provides generator operating environment data, where the operating environment data includes generator load, dew point, terminal voltage, liquid detector alarm frequency, ambient temperature, generator temperatures, barometric pressure and ozone level; and
   a monitor module including a processor and a memory, said monitor module being configured to receive the DC neutral ground signal, the NGT signal and the operating environment data, analyze the DC neutral ground signal and the NGT signal in consideration of the operating environment data to detect and predict faults in the generator, and issue an alarm if a fault is detected.

9. The system of claim 8 wherein the monitor module evaluates a magnitude and a rate of change of the DC neutral ground signal, and issues an alarm if the magnitude or the rate of change exceeds a predetermined threshold.

10. The system of claim 8 wherein the monitor module performs fault detection and prediction using a two-part analysis, where a first part includes analyzing the DC neutral ground signal in consideration of the operating environment data for a current condition, and a second part includes analyzing the DC neutral ground signal in consideration of the operating environment data for historical conditions which represent both normal and abnormal generator operation.

11. The system of claim 10 wherein the monitor module includes a learning feature, where the learning feature includes self-learning by identifying correlations between the DC neutral ground signal and the operating environment data for both normal and abnormal generator operation, and the learning feature also includes manually-programmed learning where inspection-confirmed faults in the generator or another generator of the same type are manually correlated to the DC neutral ground signal and the operating environment data during a time preceding the inspection-confirmed faults, and where output of the learning feature is used in the second part of the fault detection and prediction analysis.

12. The system of claim 8 wherein the monitor module also receives an AC neutral ground signal from a sensor capable of reading a DC component on the primary side of the NGT, converts the AC neutral ground signal to a frequency spectrum via a Fourier Transform (FT) or other method, and uses a zero hertz component of output from the frequency spectrum as a supplemental indicator of generator neutral ground direct current flow to compare to the DC neutral ground signal.

13. A method for monitoring a direct current component of a generator neutral ground signal, said method comprising:
   providing a DC neutral ground signal by a direct current (DC) sensor placed on a stator neutral ground lead of a generator, said DC sensor measuring a direct current component of a generator neutral ground current;
   providing generator operating environment data by an operating environment data module, where the operating environment data includes generator operating condition data and ambient condition data; and
   analyzing the DC neutral ground signal in consideration of the operating environment data to detect and predict faults in the generator, and issuing an alarm if a fault is detected, where analyzing the DC neutral ground signal is performed by a monitor module including a processor and a memory, said monitor module being configured to receive the DC neutral ground signal and the operating environment data,
   receiving an AC neutral ground signal from a sensor capable of reading a DC component, converting the AC neutral ground signal to a frequency spectrum via a Fourier Transform (FT), and using a zero hertz component of output from the FT as an indicator of generator neutral ground direct current flow to compare to or substitute for the DC neutral ground signal, and additionally comprising analyzing the AC neutral ground signal to detect and predict faults in the generator, and correlating faults detected and predicted through analysis of the AC neutral ground signal with faults detected and predicted through analysis of the DC neutral ground signal.

14. The method of claim 13 further comprising archiving the DC neutral ground signal data and the operating environment data for later evaluation when a fault is identified in the generator.

15. The method of claim 13 further comprising evaluating a magnitude and a rate of change of the DC neutral ground signal, and issuing an alarm if the magnitude or the rate of change exceeds a predetermined threshold.

16. The method of claim 13 wherein analyzing the DC neutral ground signal includes fault detection and prediction using a two-part analysis, where a first part includes analyzing the DC neutral ground signal in consideration of the operating environment data for a current condition, and a second part includes analyzing the DC neutral ground signal in consideration of the operating environment data for historical conditions which represent both normal and abnormal generator operation.

17. The method of claim 16 wherein the operating environment data includes generator load, dew point, terminal voltage, liquid detector alarm frequency, ambient temperature, generator temperatures, barometric pressure and ozone level.

18. The method of claim 16 wherein analyzing the DC neutral ground signal includes a learning feature, where the learning feature includes self-learning by identifying correlations between the DC neutral ground signal and the operating environment data for both normal and abnormal generator operation, and the learning feature also includes manually-programmed learning where inspection-confirmed faults in the generator or another generator of the same type are manually correlated to the DC neutral ground signal and the operating environment data during a time preceding the inspection-confirmed faults, and where output of the learning feature is used in the second part of the fault detection and prediction analysis.

* * * * *